United States Patent
Pinter et al.

(10) Patent No.: US 8,179,584 B2
(45) Date of Patent: May 15, 2012

(54) MICROMECHANICAL COMPONENT HAVING A SWIVELING PART AND METHOD FOR PRODUCING SAME

(75) Inventors: Stefan Pinter, Reutlingen (DE); Joachim Fritz, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 12/735,440

(22) PCT Filed: Nov. 21, 2008

(86) PCT No.: PCT/EP2008/065998
§ 371 (c)(1),
(2), (4) Date: Sep. 29, 2010

(87) PCT Pub. No.: WO2009/097924
PCT Pub. Date: Aug. 13, 2009

(65) Prior Publication Data
US 2011/0007376 A1    Jan. 13, 2011

(30) Foreign Application Priority Data
Feb. 4, 2008  (DE) .......................... 10 2008 007 345

(51) Int. Cl.
*G02B 26/08* (2006.01)
*G02B 26/10* (2006.01)
(52) U.S. Cl. .......................... 359/224.1; 385/18; 310/309
(58) Field of Classification Search .......................... None
See application file for complete search history.

(56) References Cited

U.S. PATENT DOCUMENTS
2004/0183149 A1*   9/2004   Schenk .......................... 257/415

FOREIGN PATENT DOCUMENTS
EP          1 410 047         4/2004

* cited by examiner

*Primary Examiner* — N Drew Richards
*Assistant Examiner* — Peter Bradford
(74) *Attorney, Agent, or Firm* — Kenyon & Kenyon LLP

(57) ABSTRACT

A micromechanical component having a base part, a swiveling part, which has an electrically conductive material, and a swiveling part insulation which electrically insulates a first and a second section of the swiveling part from each other. A first flexible, electrically conductive connecting element connects the base part to the first swiveling part section, and a second flexible, electrically conductive connecting element connects the base part to the second swiveling part section. A method also created for producing a micromechanical component includes the following steps: providing a substrate wafer that has a conductive overlayer, etching an insulation trench into the overlayer that insulates a first and second section of the overlayer from each other, as well as forming a base part and a swiveling part including the first and the second section of the overlayer from the substrate wafer, while allowing to remain a first flexible, electrically conductive connecting element, which connects the base part to the first swiveling part section, and allowing to remain a second flexible connecting element which connects the base part to the second swiveling part section.

16 Claims, 5 Drawing Sheets

MICROMECHANICAL COMPONENT HAVING A SWIVELING PART AND METHOD FOR PRODUCING SAME

BACKGROUND OF THE INVENTION

1. Field of the Invention

The present invention relates to a micromechanical component and a production method for a micromechanical component.

2. Description of Related Art

Micromechanical components are usually adjusted via electrostatic or electromagnetic drives. It is known, for example, that one may swivel micromirrors electrostatically, using comb actuators or plate actuators, which each include so-called comb electrodes or plate electrodes, from an initial position into an end position. Such micromirrors are used for the optical deflection of light beams, for instance, in projectors or scanners. Comb actuators are also used to activate acceleration sensors. One additional exemplary application for plate actuators is micropumps. In the case of an electromagnetic drive, it is customary to mount coils on the movable elements, such as on a micromirror, and permanent magnets outside the movable elements.

One variant of the micromirrors is suspended in such a way that it is able to be swiveled about two rotational axes that are perpendicular to each other. The suspension is usually made to be double Cardanic, the micromirror being suspended in a frame, using a pair of torsional springs, and the frame is suspended, using an additional pair of torsional springs, on immobile elements. Electric lines to the frame are required for the drive of the mirror and the monitoring of its position with respect to the frame using, for instance, additional electrodes acting as a sensor.

However, metallic printed circuit traces on the torsional springs, on which the frame is suspended, must be designed to be very narrow, since the available surface of the torsional springs is small. This calls for a high electrical resistance of the lines. Since metal printed circuit traces typically have ductile properties, they damp the deflection of the frame, and lower the quality of the vibrator formed of the frame and the torsional springs carrying it. As a result, for the resonant drive of the mirror, higher deflection forces are required having correspondingly higher drive voltages and/or drive currents, to compensate for the damping. Drive voltage and drive current are limited, however, among other things, by the limited surface of the torsional springs. In addition, the printed circuit traces are subject to great disruptions, based on of the deformation of the torsional springs.

SUMMARY OF THE INVENTION

The present invention creates a micromechanical component and a method for producing a micromechanical component.

In a micromechanical component having a base part and a swiveling part, which are connected to each other movably by at least two flexible connecting elements, such as torsional springs or elastic bending beams, the present invention is based on the idea of developing the flexible connecting elements themselves to be conductive, so that they may act as supply lines without metallic printed circuit traces having to be developed on the connecting elements. In this context, the swiveling part has a conductive material, and an insulation which insulates the two sections of the swiveling part electrically, with respect to each other. Of the two connecting elements, the first one is connected to the swiveling part at its first section, whereas the second one is connected to the swiveling part at its second section.

Since the swiveling part itself has a conductive material, there is in each case an electrical connection between the first and second connecting element and the respective first and second swiveling part section at which it is connected to the swiveling part. This makes it possible for the swiveling part to contact the conductive material of the swiveling part in the corresponding first or second swiveling part section, for instance, by printed circuit traces, and thus to produce an electrical connection to the base part, which runs over the first and second connecting element. The connecting elements themselves remain free of printed circuit traces and contacts, in this instance.

The electrical insulation of the first and second swiveling part section with respect to each other prevents the two connecting elements from being short-circuited electrically via the conductive material of the swiveling element. This makes it possible to guide two supply lines via the two connecting elements which are electrically independent of one another. It is possible, for example, to guide a drive electrode for driving the swiveling part and a sensor electrode for determining a current swiveling position of the swiveling part via respectively one of the connecting elements. By the provision of additional connecting elements, the number of possible electrically independent supply lines increases correspondingly.

Since the electrical connections are made available on the connecting elements without damping printed circuit traces, particularly large deflection angles of the swiveling part are achievable at a given control voltage, particularly if the swiveling part is excited to a resonant vibration. Therefore, in reverse, the control voltage may also be lowered in order to achieve a sufficient deflection so that the power consumption and the development of heat in the component fall off. Alternatively, the spring stiffness of the connecting elements may also be increased, in order to achieve the same deflection angles with greater torque at an unchanged control voltage. This has the effect of particularly low sensitivity with respect to outer interferences, advantageously short retrace time of the swiveling part, as well as great resistance to mechanical shock and electrostatic collapse.

According to one preferred refinement, the first and/or the second connecting element has the same electrically conductive material as the swiveling part. This has the advantage that the first and/or second connecting element and the swiveling part are able to be formed in one production step of the same material block. Furthermore, especially in the case of a one-piece production, there is a lower contact resistance between the first and the second connecting element on the one hand, and the swiveling part section, to which the latter is connected, on the other hand.

According to one preferred refinement, the swiveling part insulation, which, on the swiveling part, insulates the first and second swiveling part section from each other, includes an insulation trench between the first and second swiveling part section. In this way, the swiveling part sections may be developed on a wafer surface in a geometrically desired form, by using a trench etching method that is easy to carry out.

According to another preferred refinement, the swiveling part has a conductive substrate. The swiveling part insulation includes an insulating layer which insulates the first and second swiveling part section from the conductive substrate. This has the advantage that electrode blocks and other electrically conductive elements, for example, are able to be formed of the conductive substrate, without their geometrical situation along the substrate side of the insulation layer restricting the geometrical positioning possibilities of the first and second swiveling part section on the side of the insulating layer that is opposite to the substrate.

In one preferred further development, a printed circuit trace is developed on the swiveling part, which connects the first swiveling part section to the conductive substrate via an opening in the insulating layer. This has the advantage that the substrate region lying below the opening, such as, for instance, an electrode formed in this region from the substrate, is connected electrically to the base part via the printed circuit trace, the first swiveling part section and the first connecting element, so that it may be acted upon with a control voltage, for instance, from the side of the base part. In particular, it is also made possible to contact a substrate region that does not lie below the first swiveling part section when the printed circuit trace is guided via the insulation trench.

In the case of another preferred refinement, the base part has a base part insulation which electrically insulates a first and second conductive base part section from each other. The first connecting element connects the first swiveling part section to the first base part section, and the second connecting element connects the second swiveling part section to the second base part section. With that, there exists in each case an electrical connection between the first and second connecting element and the respective first and second base part section, at which it is connected to the base part. This makes it possible for the base part to contact the corresponding conductive base part section, for instance, by printed circuit traces, and thus to produce an electrical connection to the swiveling part, which runs via the first and second connecting element. The connecting elements themselves remain free of contacts and printed circuit traces on both sides.

The method of the present invention for producing a micromechanical component includes the following steps: providing a substrate wafer that has a conductive overlayer, etching an insulation trench into the overlayer that insulates a first and second section of the overlayer from each other, as well as forming a base part and a swiveling part including the first and second section of the overlayer from the substrate wafer, while allowing to remain a first flexible, electrically conductive connecting element, which connects the base part to the first swiveling part section, and allowing to remain a second flexible connecting element which connects the base part to the second swiveling part section.

According to still another refinement of the method according to the present invention, the first and/or the second connecting element are formed from the conductive overlayer. In this way, the swiveling part is able to be swiveled about a swiveling axis that runs in the overlayer parallel to the wafer plane, so that a large torque is able to be generated about the swiveling axis, for instance, using the electrodes formed from the substrate.

According to one preferred refinement, the etching of the insulating trench takes place isotropically. This has the advantage that sidewalls of the insulating trench are given a slantwise course, so that printed circuit traces, which cross the insulating trench, are able to be applied to the overlayer.

BRIEF DESCRIPTION OF THE SEVERAL VIEWS OF THE DRAWINGS

In the following, the present invention is explained in greater detail with the aid of the exemplary embodiments shown in the schematic figures of the drawings.

DETAILED DESCRIPTION OF THE INVENTION

Figure 1:
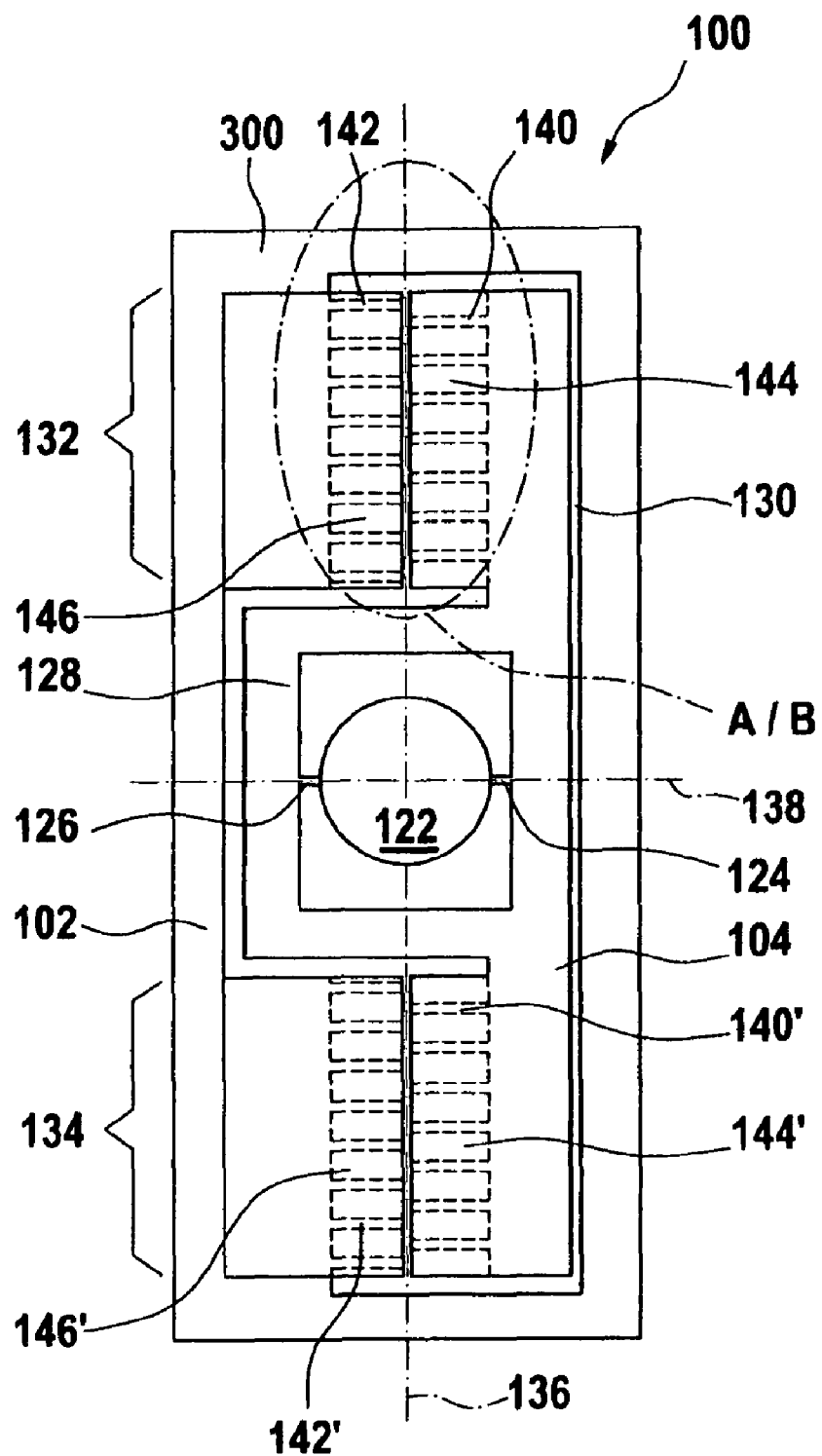
FIG. 1 shows a summary type of top view onto a micromechanical component according to a specific embodiment of the present invention.

Unless specifically mentioned otherwise, identical or functionally equivalent elements have been provided with the same reference numerals in all the figures of the drawings.

Figure 2A:
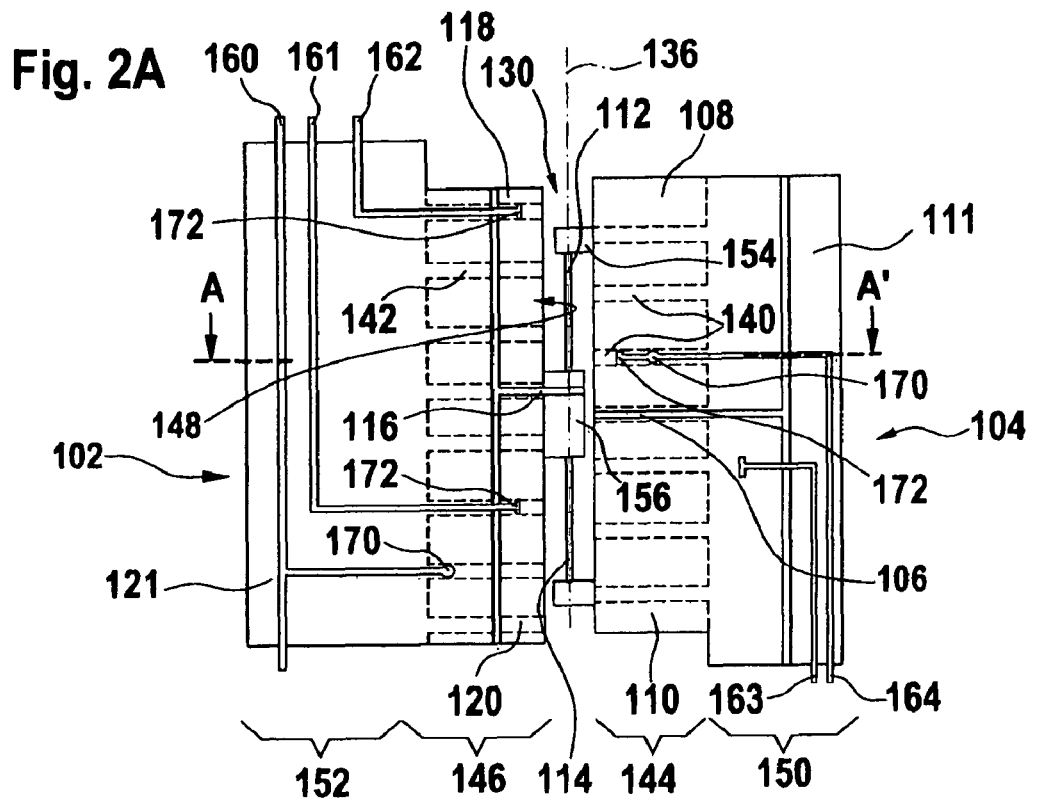
FIG. 2A shows an enlarged view of a detail cutout, marked in FIG. 1, of the micromechanical component of FIG. 1.

In FIG. 1, a summary type of top view shows a micromirror device 100, which represents a micromechanical component 100 according to one specific embodiment of the present invention. FIG. 2A shows an enlarged view of a detailed cutout of the micromirror device of FIG. 1 marked in FIG. 1 by A/B. Micromirror device 100 is produced from a multilayer wafer, which has a conductive substrate, such as, for instance, a suitably doped silicon or another semiconductor material, a conductive, thinner overlayer 300 made of the same material or a different material, and an insulating intermediate layer, made of silicon oxide, for example, between the substrate and overlayer 300. The top view of FIGS. 1 and 2A corresponds to a view from above onto overlayer 300, perpendicular to the wafer plane.

Micromirror device 100 includes a base part 102, which surrounds in a frame-like manner a swiveling part 104 that is separated from it by a continuous gap 130. Swiveling part 104 is suspended on base part 102 in a springy manner by torsional springs 112, 114, which, for the sake of clarity, are shown only in the detailed view of FIG. 2A, and is able to be swiveled, going into the plane of the drawing, with respect to base part 102 about an axis 136 defined by torsional springs 112, 114. All in all, the micromirror device has four torsional springs 112, 114 along axis 136, of which a first torsional spring 112, and a second torsional spring 114, are situated in a first suspension region 132, shown in FIG. 2A, and two additional torsional springs are situated in a second suspension region 134. Axis 136 runs in the middle of gap 130 between the base 102 and swiveling part 104 in suspension regions 132, 134, at the height of overlayer 300. The torsional springs 112, 114 are suspended on projections 154, 156, which project from swiveling part 104 and base part 102 respectively, out beyond axis 136 into gap 130.

Between the two suspension regions 132, 134, swiveling part 104 has an inner frame 128 that is rectangular, for example, inside of which a mirror plate 122, that is circular, for instance, is suspended between two additional torsional springs 124, 126. Additional torsional springs 124, 126 are situated along an additional axis 138, that run at right angles to axis 136, so that overall, a double Cardanic suspension 112, 114, 128, 124, 126 results of mirror plate 122 on base part 102.

In the two suspension regions 132, 134, along a plane which runs perpendicular to the plane of the drawing, through axis 136, an electrode block 144 of swiveling part 104 and an electrode block 146 of base part 102 are facing each other. The two electrode blocks 144, 146 are formed of the substrate of the wafer, and each includes a set of parallel plate electrodes 140, 142, of which each is positioned in a plane running perpendicular to axis 136. Because electrode blocks 144, 146 are covered by overlayer 300 lying on top of them, in the top view shown, the outlines of plate electrodes 140, 142 are reproduced in dashed lines. One plate electrode 140 of swiveling part 104 in each case faces a gap 148 between two plate electrodes 142 of base part 102, which is wider than plate electrode 142, so that, during operation of the micromirror device, during the swiveling of swiveling part 104 about axis 136 into the plane of the drawing, the two electrode blocks 144, 146 are displaced into each other without touching.

On the side of electrode blocks 144, 146 facing away from axis 136, there is in each case a massive substrate block 150 or 152 adjacent to corresponding electrode blocks 144, 146, which supports plate electrodes 140, 142. Plate electrodes 140 and 142 of each of the two blocks 144, 146 are electrically connected to each other via supporting substrate blocks 150, 152. Above electrode blocks 140, 142 and massive substrate blocks 150, 152 there runs the insulating intermediate layer, and on it, there runs conductive overlayer 300, so that in the top view shown, the view onto plate electrodes 140, 142 is concealed by overlayer 300 and the intermediate layer.

On the part of swiveling part 104, insulation trenches 106 are etched into overlayer 300, which extend to the insulating intermediate layer, and which laterally divide overlayer 300 of swiveling part 104, within the first suspension region shown in FIG. 2A, into a first 108, second 110 and third 111 swiveling part section, so that the conductive material of overlayer 300 in the three sections 108, 110, 111 are insulated from one another by the intermediate layer not lying in insulating trenches 106 and lying under overlayer 300, with respect to the conductive material of overlayer 300 in the respectively other ones of sections 108, 110, 111.

On the part of base part 102, in the same way, corresponding insulation trenches 116 are etched into overlayer 300, which extend to the insulating intermediate layer, and which laterally divide overlayer 300 of swiveling part 102, within the first suspension region shown in FIG. 2A, into a first 118, second 120 and third 121 base part section, so that the conductive material of overlayer 300 in the three sections 108, 110, 121 are insulated from one another by the intermediate layer not lying in insulating trenches 116 and lying under overlayer 300, with respect to the conductive material of overlayer 300 in the respectively other ones of sections 108, 120, 121.

First swiveling part section 108 includes projection 154, via which first torsional spring 112 is fastened to swiveling part 104. First base part section 118 includes a part of projection 156 that is separated by insulating trench 116, via which first torsional springs 114 is fastened to base part 102. First torsional springs 112 has the same conductive material as overlayer 300 in first swiveling part section 108 and first base part section 118. That is why first base part section 118, first torsional spring 112 and first swiveling part section 108 form an electrically conductive supply line 118, 112, 108 from base part 102 onto swiveling part 104. An additional electrically conductive supply line from base part 102 onto swiveling part 104 is formed, in an analogous manner, by second base part section 120, second torsional springs 114 and second swiveling part section 110. By also providing corresponding insulating trenches, not shown in FIG. 1, in second suspension region 134, via the four torsional springs along axis 136, altogether four electrical supply lines, that are independent of one another, and are insulated from one another by insulation trenches 106, 116, are able to be provided from base part 102 onto swiveling part 104.

Figure 3:
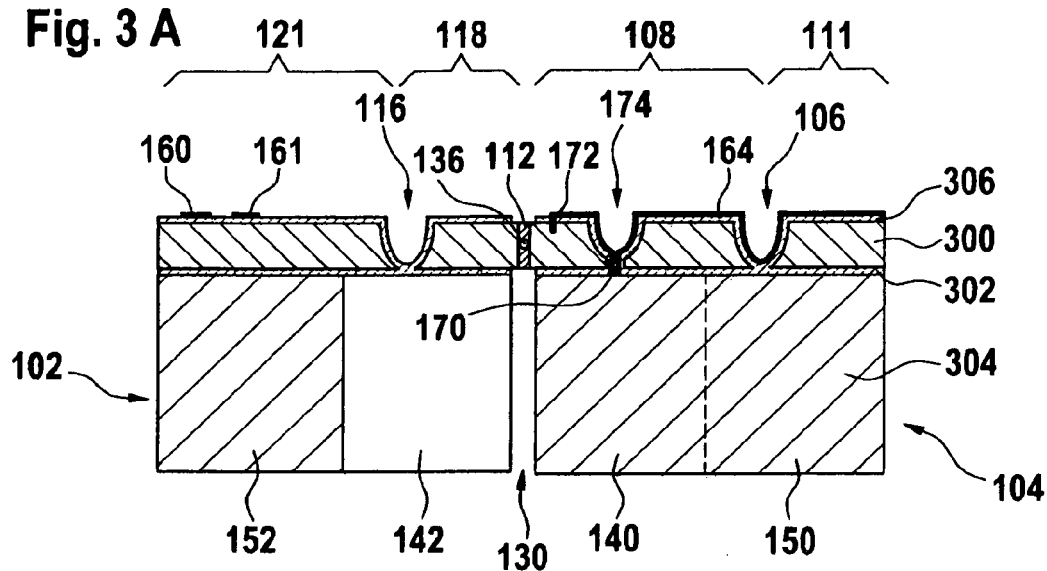
FIG. 3A shows a cutout-type of cross sectional view of the micromechanical component of FIGS. 1 and 2A.
FIG. 3B shows a cutout-type of cross sectional view of the micromechanical component of FIGS. 1 and 2A, in a deflected state.
Figure 3:
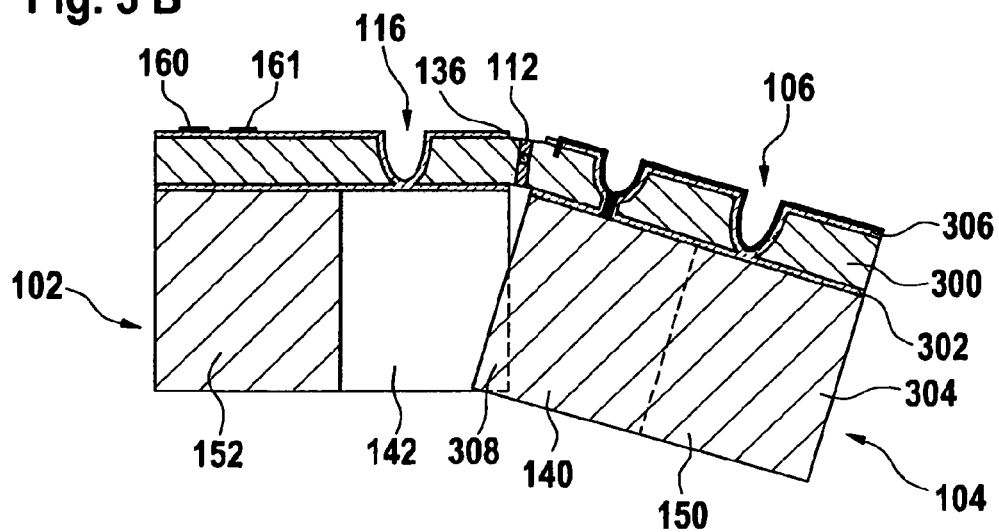

FIG. 3A shows a cutout-like cross sectional view of micromirror device of FIGS. 1 and 2A, whose sectional surface is marked as A-A' in FIG. 2A, and runs perpendicular to the plane of the drawing in FIGS. 1 and 2A. The cross sectional view clarifies the structure of the device, that is made of a multi-layer wafer which includes a thick substrate 304, an insulating layer 302 and an overlayer 300. Plate electrodes 140, 142 and massive blocks 150, 152 supporting them are formed from substrate 304. Overlayer 300 is totally insulated by insulating layer 302 from substrate plane 304. Insulating trenches 106, 116, that reach down to insulating layer 302, which insulate sections 108, 111 and 118, 121 of overlayer 300 laterally from one another, have a cross section that tapers in the downward direction, which may be produced, for instance, by an isotropically acting etching method.

Metallic printed circuit traces 160-164 are developed on overlayer 300, which are electrically insulated from overlayer 300 by a suitably underlaid printed circuit trace insulating layer 306. Printed circuit trace insulating layer 306 also covers the inclined walls of insulating trenches 106, 116. In exemplary fashion, FIG. 3A also shows the course of printed circuit trace 164 along line A-A'. Printed circuit trace 164 crosses insulating trench 106, by running on its inclined, gently curved walls, which are continuously underlaid by printed circuit trace insulating layer 306. At a substrate contacting location 170, a funnel-shaped depression 174 is etched into overlayer 300, which, same as insulating trenches 106, 116, has inclined, gently curved sidewalls, which are covered by printed circuit trace insulating layer 306. In the center of funnel-shaped depression 174, insulating intermediate layer 302, that runs under overlayer 300, is broken through towards the substrate, for example, by an etching step during production, which locally and selectively removes the material of intermediate layer 302. At this location 170, the printed circuit trace contacts substrate 304, in the vicinity of plate electrode 140. At an overlayer contact location 172, in first swiveling part section 108, printed circuit trace insulating layer 306 is broken through, so that printed circuit trace 164 contacts first swiveling part section 108. As may be seen in FIG. 2A, printed circuit trace 164 is continued in the direction of mirror frame 128.

On base part 102, a correspondingly formed printed circuit trace 162 runs to an overlayer contact location 172 in first base part section 118. With that, there is provided overall an electrical supply line from the end of printed circuit trace 162 at the edge of the base part, via its overlayer contact location 172, first base part section 118, first torsional spring 112, first swiveling part section 108, overlayer contact location 172 of printed circuit trace 164, printed circuit trace 164 and substrate contacting location 170 of printed circuit trace 164 to plate electrode 140. During operation, this supply line may be used, for example, to control plate electrodes 140 of electrode block 144. The continuation of printed circuit trace 164 in the direction of mirror frame 128 is furthermore able to provide, for instance, a connection to a similar electrode block 144' of swiveling part 104 in second suspension region 134, so that plate electrodes 140, 140' of the swiveling part are able to be controlled in common on both sides of mirror frame 128 via printed circuit trace 162.

An additional electrical connection from the edge of base part 102 is provided by printed circuit trace 161, an overlayer contact location 172 in second base part section 120, second torsional spring 114, an additional overlayer contact location 172 in second swiveling part section 110 and printed circuit trace 163 running on swiveling part 104. Via this connection, for example, a sensor electrode, that is not shown, on mirror frame 128 is able to be operated, using which the deflection position of mirror frame 128 is able to be monitored. Printed circuit trace 160, substrate contacting location 170 that is contacted to it, provide an electrical supply line from the edge of base part 102 to plate electrodes 142 in electrode block 146 of base part 102. The continuation of printed circuit trace 160 shown, in the direction of second suspension region 134 may furthermore provide, for instance, a connection to a similar electrode block 146' of base part 102 in second suspension region 134, so that plate electrodes 142, 142' of base part 102 are overall able to be controlled via printed circuit trace 160.

FIG. 3B shows micromirror device 100 of FIGS. 1, 2A and 3A in a deflected state, in which swiveling part 104 has been swiveled about axis 136 with respect to base part 102. During the swiveling, a partial overlapping 308 of plate electrodes 140, 142 takes place, the area of overlapping 308 becoming larger with progressive swiveling. Plate electrodes 140, 142 of swiveling part 104 and base part 102 that partially overlap in this fashion, form a plate capacitor, whose capacitance increases with increasing swiveling.

In the operation of micromirror device 100, if an electric voltage is applied to printed circuit traces 160 and 162, electrode blocks 144, 146 of swiveling part 104 and base part 102 are at different potentials. Plate electrodes 140, 142 of both blocks 144, 146 are pulled into each other in comb-like fashion without touching each other. Thus, in principle, a large swiveling angle is achievable as a function of the control voltage.

Figure 2B:
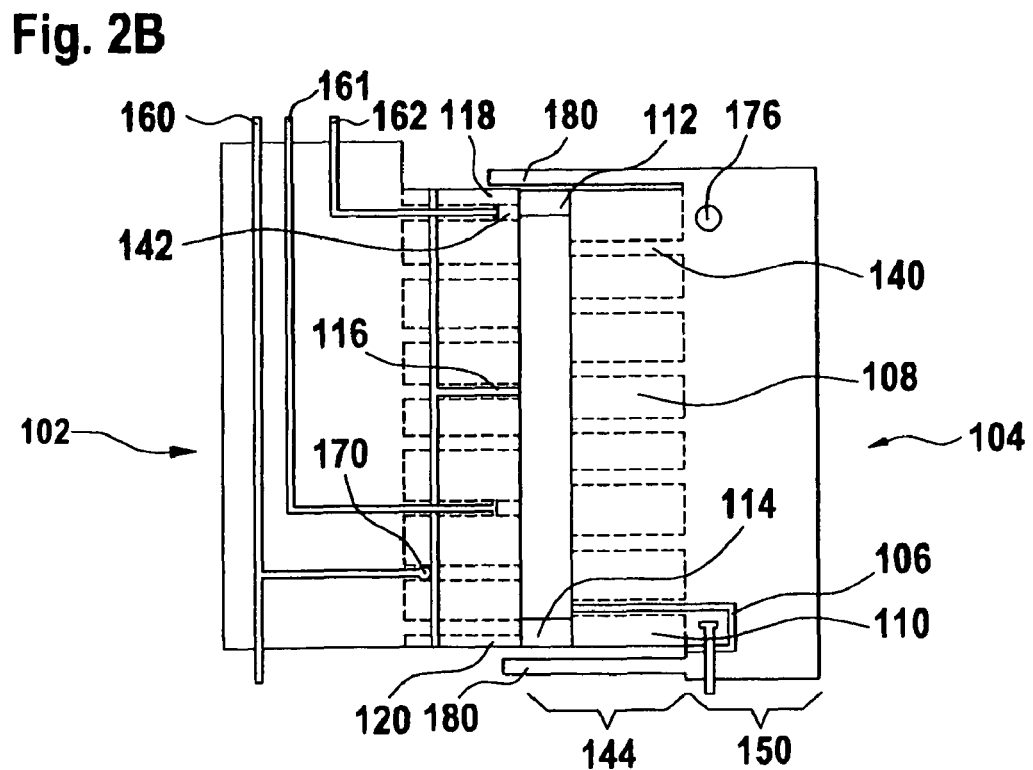
FIG. 2B shows an enlarged view of a detail cutout marked in FIG. 1, for an additional, modified specific embodiment of a micromechanical component.

FIG. 2B shows an enlarged view of the detailed cutout marked in FIG. 1, for an additional, modified specific embodiment. By contrast to the specific embodiment of FIGS. 1 and 2A, the specific embodiment of FIGS. 1 and 2B has elastic bending beams 112, 114 as connecting elements between base part 102 and swiveling part 104. Such bending beams may be formed, for instance, from an additionally applied thin layer made of a conductive material, such as epitaxially applied polysilicon. A further difference is that in first swiveling part section 108, a local contact location 176 is developed in a funnel-shaped depression in overlayer 300, which directly produces an electrical contact between overlayer 300 in first swiveling part section 108 and massive substrate 150 lying below it. With that, there exists an electric supply line to plate electrodes 140 of swiveling part 104 via printed circuit trace 162, first base part section 118, bending beam 112, first swiveling part section 108, local contact location 176 and massive substrate block 150.

Furthermore, this specific embodiment shows elongated starter electrodes 180, which also overlap in a non-deflected state with opposite plate electrodes 142, in order to avoid a non-steady torque curve in response to activation from the stationary position. Alternatively to such starter electrodes, a steady torque curve may be achieved by operating the device, during operation, only above a minimum deflection angle of 1°, for example. In such an operating mode, in addition, interfering optical reflections of the light deflected by mirror 122 to entrance windows and exit windows situated parallel to the wafer plane may be avoided.

Figure 4:
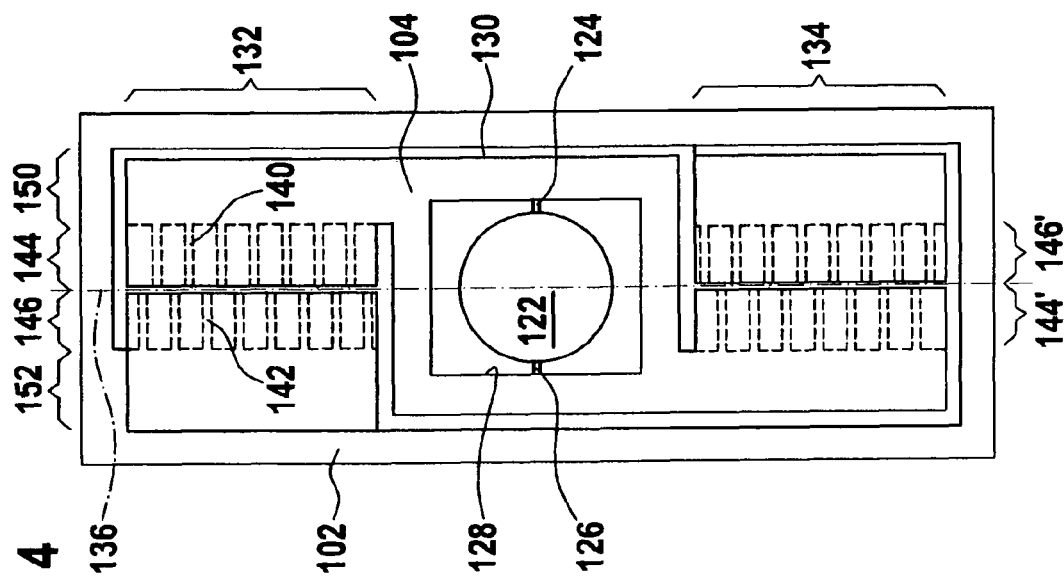
FIG. 4 shows a summary type of top view onto a micromechanical component according to an additional specific embodiment of the present invention.

FIG. 4 shows a micromechanical component in a summary-type top view, according to an additional specific embodiment. As in the summary-type top view of FIG. 1, for the sake of clarity, no insulating trenches 106, 116, printed circuit traces 160-164 and connecting elements 112, 114 are shown between base part 102 and swiveling part 104. These are present, however, in analogous manner to the specific embodiment of FIG. 1. In the present specific embodiment, in second suspension region 134 the positions of electrode blocks 144', 146' are exchanged, relative to the position of electrode blocks 144, 146 in the first suspension region. By the independent activation either of electrode blocks 144, 146 in first suspension region 132, or of electrode blocks 144', 146' in second suspension region 134, mirror 122 is able to be deflected about axis 136 in different swiveling directions.

Figure 5:
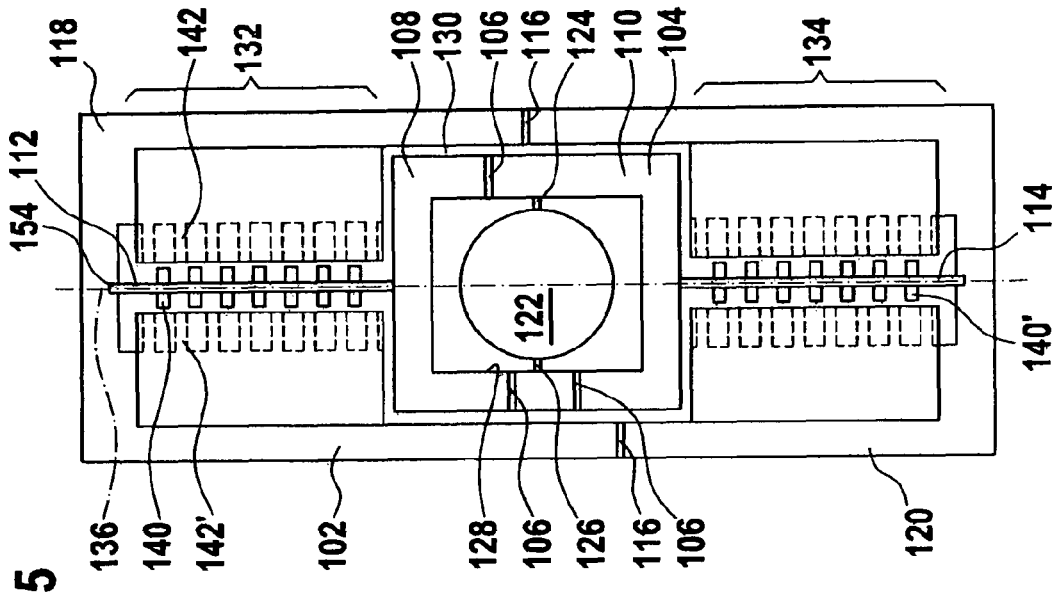
FIG. 5 shows a summary type of top view onto a micromechanical component according to still another specific embodiment of the present invention.

FIG. 5 shows a micromechanical component in a summary-type top view, according to an additional specific embodiment. For the sake of clarity, no printed circuit traces 160-164 are shown. These are present, however, in an analogous manner to the specific embodiment of FIG. 1. In the present specific embodiment, in each of suspension regions 132, 134 electrode blocks of base part 102 are facing each other pairwise. Mirror frame 128 is suspended as swiveling part 104 between two torsional springs 112, 114, which in each of suspension regions 132, 134 extend along the entire center line between the electrode blocks of base part 102 that face one another pairwise. Movable plate electrodes 140 are suspended on torsional springs 112, 114, which are able to be swiveled in both directions about axis 136, depending on the control.

Two insulating trenches 106 are developed on mirror frame 128, which insulate a first section 108 and a second section 110 of mirror frame 128, that is able to be swiveled, from each other. Analogous insulating trenches 116 insulate a first base part section 118 and a second base part section 120 from each other. In this way, torsional springs 112, 114 are electrically insulated from each other, which makes possible to connect movable plate electrodes 140, 140' in the two suspension regions 132, 134 in a different manner, for instance, by using plate electrodes 140 for driving and plate electrodes 140' for position detection. In addition, mirror 122 and, if necessary, electrodes developed on its backside may be electrically operated via frame torsional spring 114 and mirror torsional springs 124.

Figure 6:
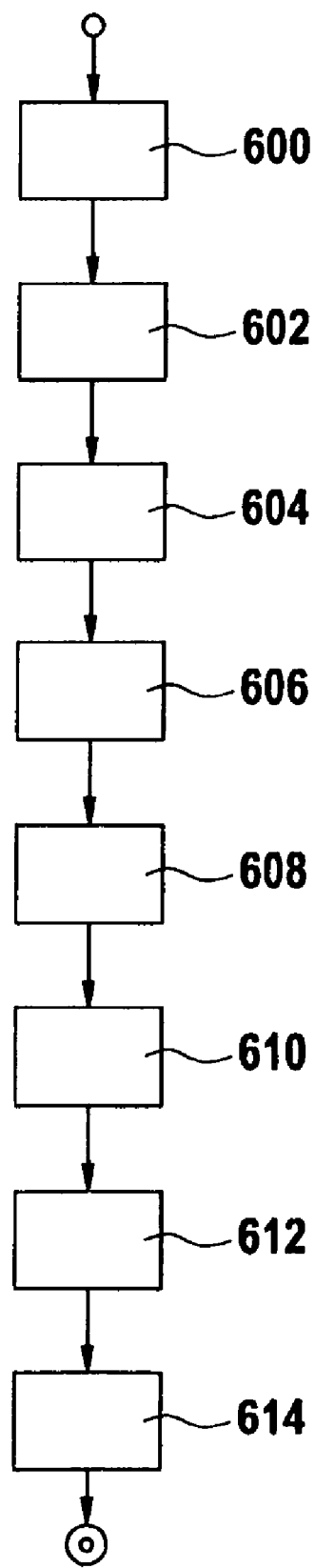
FIG. 6 shows a flow chart of a production method for a micromechanical component according to one specific embodiment.

FIG. 6 shows a flow chart of a production method for a micromechanical component according to one specific embodiment. In Step 600, an SOI wafer made of an oxide material is provided, having a thick substrate layer, a thinner overlayer and an insulating intermediate layer. Such a wafer may be commercially procured, for example, or produced using known methods, such as via the SIMOX method or the epitaxial application of polysilicon on an oxide layer.

In Step 602, additional electrical elements, such as piezoresistant elements, are applied optionally onto the overlayer, for instance, using usual semiconductor processes.

In Step 604, after applying and patterning a suitable etching mask, an insulating trench is etched into the overlayer up to the intermediate layer, using an isotropically acting etching method, so that the insulating trench insulates a first and a second section of the overlayer laterally from each other. Furthermore, point-for point etching may take place at locations at which contacts between the overlayer and the substrate are to be developed.

In Step 606, a continuous insulating layer 306 is applied, which continuously covers the surface of the overlayer and also the inside of the insulating trenches etched in Step 604 or the depressions etched point-by-point in Step 604.

In Step 608, insulating layer 306, that was applied in Step 606, is opened at such locations, towards the overlayer, at which a contact is to be developed between a printed circuit trace and the overlayer. At locations at which a contact is to be developed between the overlayer and the substrate, or between a printed circuit trace and the substrate, at the bottom of depressions which were etched in Step 604 down to the intermediate layer, insulating layer 306 and, if necessary, the intermediate layer still lying under it, are opened all the way to the substrate.

In Step 610 a metallic layer is applied and patterned, in order to develop printed circuit traces and terminal pads such as soldering eyelets, at the places at which the insulating layer and, if necessary, the intermediate layer were opened, a corresponding contact being produced between the printed circuit traces, the overlayer or the substrate.

In Step 612, starting from the substrate side of the wafer, comb electrodes are etched using a trench etching method, an insulating trench in the substrate, reaching up to the insulating intermediate layer, separating a region of a base part and a region of a swiveling part, that is to be developed to be swiveled with respect to the base part, from each other.

In Step 614, starting from the side of the overlayer, using a suitable trench etching method between the regions of the base part and the swiveling part, at least two connecting elements such as bending beams or torsional springs are developed from the conductive material of the overlayer, namely, in such a way that the base part is connected via one of the connecting elements to the first swiveling part section, and via an additional one of the connecting elements to the second swiveling part section. The exposed intermediate layer is removed at suitable locations in such a way that the base part and the swiveling part are still connected only at the connecting elements, and are able to be swiveled elastically with respect to each other.

The invention claimed is:

1. A micromechanical component, comprising:
   a base part;
   a swiveling part, which has an electrically conductive material;
   a swiveling part insulation, which electrically insulates a first section and a second section of the swiveling part from each other;
   a first flexible, electrically conductive connecting element, which connects the base part to the first swiveling part section; and
   a second flexible, electrically conductive connecting element, which connects the base part to the second swiveling part section;
   wherein the swiveling part has a conductive substrate, and the swiveling part insulation includes an insulating layer, which insulates the first swiveling part section and the second swiveling part section from the conductive substrate.

2. The component as recited in claim 1, wherein at least one of the first and the second connecting element has the electrically conductive material.

3. The component as recited in claim 1, wherein the swiveling part insulation includes an insulating trench between the first swiveling part section and the second swiveling part section.

4. The component as recited in claim 2, wherein the swiveling part insulation includes an insulating trench between the first swiveling part section and the second swiveling part section.

5. The component as recited in claim 1, wherein a printed circuit trace is developed on the swiveling part, which connects the first swiveling part section to the conductive substrate through an opening in the insulating layer.

6. The component as recited in claim 2, wherein a printed circuit trace is developed on the swiveling part, which connects the first swiveling part section to the conductive substrate through an opening in the insulating layer.

7. The component as recited in claim 3, wherein a printed circuit trace is developed on the swiveling part, which connects the first swiveling part section to the conductive substrate through an opening in the insulating layer.

8. The component as recited in claim 7, wherein the printed circuit trace is guided over the insulating trench.

9. The component as recited in claim 1, wherein the base part has a base part insulation, which electrically insulates a first base part section and a second base part section from each other, the first connecting element connecting the first swiveling part section to the first base part section and the second connecting element connecting the second swiveling part section to the second base part section.

10. The component as recited in claim 2, wherein the base part has a base part insulation, which electrically insulates a first base part section and a second base part section from each other, the first connecting element connecting the first swiveling part section to the first base part section and the second connecting element connecting the second swiveling part section to the second base part section.

11. The component as recited in claim 3, wherein the base part has a base part insulation, which electrically insulates a first base part section and a second base part section from each other, the first connecting element connecting the first swiveling part section to the first base part section and the second connecting element connecting the second swiveling part section to the second base part section.

12. The component as recited in claim 5, wherein the base part has a base part insulation, which electrically insulates a first base part section and a second base part section from each other, the first connecting element connecting the first swiveling part section to the first base part section and the second connecting element connecting the second swiveling part section to the second base part section.

13. A method for producing a micromechanical component, comprising:
   providing a substrate wafer, which has a conductive overlayer;
   etching an insulating trench into the overlayer, which insulates a first section of the overlayer and a second section of the overlayer from each other; and
   forming a base part and a swiveling part that includes the first section of the overlayer and the second section of the overlayer from the substrate wafer, while allowing to remain a first flexible, electrically conductive connecting element, which connects the base part to the first swiveling part section, and allowing to remain a second flexible, electrically conductive connecting element, which connects the base part to the second swiveling part section;
   wherein the swiveling part has a conductive substrate, and the insulating trench includes an insulating layer, which insulates the first swiveling part section and the second swiveling part section from the conductive substrate.

14. The method as recited in claim 13, wherein at least one of the first connecting element and the second connecting element are formed from the conductive overlayer.

15. The method as recited in claim 13, wherein the etching of the insulating trench takes place isotropically.

16. The method as recited in claim 14, wherein the etching of the insulating trench takes place isotropically.

* * * * *